| (12) United States Patent | (10) Patent No.: US 6,385,095 B2 |
|---|---|
| Koshikawa | (45) Date of Patent: May 7, 2002 |

(54) SEMICONDUCTOR MEMORY DEVICE

(75) Inventor: Yasuji Koshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/729,541

(22) Filed: Dec. 4, 2000

(30) Foreign Application Priority Data

Dec. 17, 1999 (JP) .......................................... 11-359580

(51) Int. Cl.[7] .............................................. G11C 16/04
(52) U.S. Cl. ................................................ 365/189.05
(58) Field of Search ........................... 365/189.05, 220, 365/221, 230.05, 230.08

(56) References Cited

U.S. PATENT DOCUMENTS 5,568,428 A * 10/1996 Toda ...................... 365/189.05
5,724,281 A * 3/1998 Nagaba ........................ 365/63
6,029,210 A * 2/2000 Yamazaki .................... 710/10

FOREIGN PATENT DOCUMENTS

JP 6-150643 5/1994

* cited by examiner

*Primary Examiner*—Richard Elms
*Assistant Examiner*—Anh Phung
(74) *Attorney, Agent, or Firm*—Hutchins, Wheeler & Dittmar

(57) ABSTRACT

A semiconductor memory device is provided in which no delay in writing of data occurs due to increases in the output load of the data input circuit, and which is also compatible with various bit configurations. The device comprises a plurality of data input circuits for inputting data from an external source, and a plurality of data write circuits for writing data input from the plurality of data input circuits to a memory cell array. The data to be stored is input from an external source by selectively using the plurality of data input circuits, and then each bit to be stored is distributed to the plurality of data write circuits according to the bit configuration of the data. Of the plurality of data input circuits, data input from a specific data input circuit is distributed to one of the plurality of data write circuits via another data input circuit.

9 Claims, 8 Drawing Sheets

SEMICONDUCTOR MEMORY DEVICE

BACKGROUND OF THE INVENTION

1. Field of the Invention

The present invention relates to a semiconductor memory device such as DRAM (Dynamic Random Access Memory), and in particular to a semiconductor memory device compatible with the data of a plurality of types of bit configuration, such as ×16 bit (16 bit width) configuration, ×8 bit (8 bit width) configuration and ×4 bit (4 bit width) configuration.

2. Description of the Related Art

Conventionally, large capacity semiconductor memory devices as represented by DRAM are constructed to be compatible with multiple types of data from varying bit configurations, such as ×16 bit configurations, ×8 bit configurations and ×4 bit configurations by adaptation during the manufacturing process, in order to meet the needs of a variety of users.

However, despite the large increase in the capacity of semiconductor memory devices due to improvements in refined manufacturing technology, some users may demand semiconductor memory devices with even larger memory capacity. For example, the currently most common 256 megabit DRAM is compatible with three types of bit configuration, ×16 bit configuration, ×8 bit configuration and ×4 bit configuration. However depending on the user, there may be a situation where for example 512 megabits memory capacity is needed in an ×4 bit configuration.

In order to satisfy the needs of this kind of user, it would be satisfactory to develop a new semiconductor memory device that has more memory capacity, but developing a new semiconductor memory device requires time, and these needs cannot be satisfied quickly.

As an alternative technology until a new semiconductor memory device is developed, for example, a method has been proposed where a conventional semiconductor memory device which is compatible with data of an ×2 bit (2 bit width) configuration in addition to the aforementioned three types of bit configuration is constructed, and two of these semiconductor memory devices are then used to realize the appearance of an ×4 bit configuration semiconductor memory device of increased capacity.

FIG. 7 shows a sample construction of a data write system of a semiconductor memory device that in addition to the aforementioned three types of bit configuration, namely ×16 bit configuration, ×8 bit configuration and ×4 bit configuration, is also compatible with ×2 bit configuration. The semiconductor memory device shown in this diagram includes data input circuits (DIN in the figure) 700–715 for inputting 16 bit data DQ0–DQ15 from an external source, and data write circuits (WAMP in the figure) 800–815 for writing the data input by the data input circuits to a memory cell array 900.

The data output from the data input circuit 700 is distributed to eight data write circuits 800–803 and 812–815. The data output from the data input circuit 701 is distributed only to the data write circuit 801, the data output from the data input circuit 702 is distributed to two data write circuits 802, 803, and the data output from the data input circuit 703 is distributed only to the data write circuit 803. The data output from the data input circuit 715 is distributed to four data write circuits 812–815, the data output from the data input circuit 714 is distributed only to the data write circuit 814, the data output from the data input circuit 713 is distributed to two data write circuits 812, 813, and the data output from the data input circuit 712 is distributed only to the data write circuit 812.

Similarly, the data output from the data input circuit 704 is distributed to eight data write circuits 804–811, the data output from the data input circuit 705 is distributed only to the data write circuit 805, the data output from the data input circuit 706 is distributed to two data write circuits 806 and 807, and the data output from the data input circuit 707 is distributed only to the data write circuit 807. The data output from the data input circuit 711 is distributed to four data write circuits 808–811, the data output from the data input circuit 710 is distributed only to the data write circuit 810, the data output from the data input circuit 709 is distributed to two data write circuits 808, 809, and the data output from the data input circuit 708 is distributed only to the data write circuit 808.

Of the sixteen data write circuits 800–815, a mask signal LWM for masking the writing of the lower 8 bits of the 16 bit data DQ0–DQ15 which is input from an external source, is input into the data write circuits 800–807. A mask signal UWM for masking the writing of the upper 8 bits of the 16 bit data DQ0–DQ15, is input into the data write circuits 808–815.

FIG. 8 shows the structure of a mask signal generation circuit 850 for generating the upper bit range mask signal UWM and the lower bit range mask signal LWM.

In FIG. 8, a mask control signal UDQM for the upper 8 bits, which is received from an external source, is received by an input circuit 851 and is then output via a buffer consisting of inverters 852 and 853 to the data write circuits 808–815 shown in FIG. 7 as the mask signal UWM. Furthermore, a mask control signal LDQM for the lower 8 bits, which is received from an external source, is received by an input circuit 854 and is then output via a buffer consisting of inverters 855 and 856 to the data write circuits 800–807 shown in FIG. 7 as the mask signal LWM.

In this example, in the handling of 16 bit data, the mask signal UWM and the mask signal LWM are activated complementarily, and the data write circuits 800–807 and the data write circuits 808–915 are controlled complementarily. Consequently, of the 16 bit data DQ0–DQ15, the writing of the lower 8 bit range data DQ0–DQ7 and the upper 8 bit range data DQ8–DQ15 are respectively masked. Furthermore, in the handling of 2 bit data, 4 bit data, and 8 bit data, then as shown in the construction of FIG. 8, as a result of the formation of a signal path PJ from the input circuit 851 to the input circuit 854, the mask signal UWM and the mask signal LWM become equivalent, and only the mask control signal UDQM, which is received from an external source, is valid. In this case, for data from each of an ×2 bit configuration, an ×4 bit configuration and an ×8 bit configuration, the mask control signal UDQM controls whether or not the writing of all bits will be masked.

In FIG. 7, the memory cell array 900 incorporates an address signal map which is used according to the bit configuration of the data to be stored. In this example, when 16 bit data is to be stored, none of address signals Y9, Y11, Y12 are used, and the 16 bit data output from the data write circuits 800–815 is written directly to the memory cell array 900. Furthermore, when 8 bit data is stored, either the data write circuits 801, 803, 805, 807, 808, 810, 812, 814, or the data write circuits 800, 802, 804, 806, 809, 811, 813, 815 are selected by the address signal Y9. In this case, the address signals Y11, Y12 are not used.

In addition, when 4 bit data is stored, either the data write circuits 802, 803, 806, 807, 808, 809, 812, 813 or the data write circuits 800, 801, 804, 805, 810, 811, 814, 815 are selected according to the address signal Y11, and one quarter of the totality of data write circuits are selected by the address signals Y9 and Y11. In this case the address signal Y12 is not used. Furthermore, when 2 bit data is stored, either the data write circuits 800–807 or the data write circuits 808–815 are selected according to the address signal Y12, and one eighth of the totality of data write circuits are selected according to the address signals Y9, Y11 and Y12.

Although not shown in the figure, the data output from the data write circuits selected by the address signals Y9, Y11 and Y12 is written to a predetermined memory cell in the memory cell array 900 based on other address signals.

In conventional semiconductor memory devices with this kind of structure, when, for example, 16 bit data is to be stored in memory, the data write circuit 800 receives the data output from the data input circuit 700, and the data write circuit 801 receives the data output from the data input circuit 701, and in this manner the circuits are produced in the manufacturing process so that the data write circuits 800–815 each receive the data output from one corresponding data input circuit.

Furthermore when, for example, 8 bit data is to be stored in memory, the data write circuits 800, 801 receive the data output from the data input circuit 700, and the data write circuits 802, 803 receive the data output from the data input circuit 702, and in this manner the circuits are produced in the manufacturing process so that the data output from one data input circuit is received by two data write circuits.

Moreover, when 4 bit data is to be stored in memory, the data write circuits 800–803 receive the data output from the data input circuit 700, and the data write circuits 812–815 receive the data output from the data input circuit 715, and in this manner the circuits are produced in the manufacturing process so that the data output from one data input circuit is received by four data write circuits.

Furthermore, when 2 bit data is to be stored in memory, the data write circuits 800–803 and 812–815 receive the data output from the data input circuit 700, and data write circuits 804–811 receive the data output from data input circuit 704, and in this manner the circuits are produced in the manufacturing process so that the data output from one data input circuit is received by eight data write circuits.

In the above example, when 8 bit data is to be stored in memory, the decision as to which of the data write circuits 800, 801, which both receive common data output from the data input circuit 700, will provide data to be written to the memory cell array 900, is determined based on an externally received column address signal.

However, according to the aforementioned conventional semiconductor memory device, the data is distributed directly from the data input circuit to the data write circuit based on the bit configuration of the data to be stored. As a result, a problem arises in that the output load of a specific data input circuit shared by a plurality of bit configurations will increase markedly, causing delays in the data when data is being written.

For example, in the example shown in FIG. 7, in order to be compatible with ×2 bit configuration, the data output from the specific data input circuit 700 must be distributed to the eight data write circuits 800–803 and 812–815, and this means that the output load of the data input circuit 700 will increase markedly. As a result, even when other bit configurations such as ×4 bit configurations are taken, the output load of the specific data input circuit 700 increases, and the data DQ0 is delayed at the time of writing. In the example shown in FIG. 7, the same can be said for the data input circuit 704.

Furthermore, when the variety of bit configuration types increases, the map incorporated in the memory cell array 900 shown in FIG. 7 becomes more complex. Consequently, another problem arises in that that the circuitry used to determine which of the plurality of data write circuits will provide the output data which is ultimately written to the memory cell array becomes more complex.

SUMMARY OF THE INVENTION

In view of the above circumstances, an object of the present invention is to provide a semiconductor memory device which is capable of handling data of various bit configurations, without causing any delay in the writing of data due to an increased output load of a specific data input circuit, and where circuitry that determines which data is ultimately written to a memory cell array does not become more complex even when the variety of bit configurations increases.

In order to achieve this object, the present invention is of a construction described below.

A semiconductor memory device according to the present invention is a semiconductor memory device which is compatible with data (for example, elements corresponding with data DQ0–DQ15 described below) of a plurality of types of bit configuration (for example, ×2 bit configuration, ×4 bit configuration, ×8 bit configuration, and ×16 bit configuration as described below), and which comprises; a plurality of data input circuits (for example, components corresponding with data input circuits 100–115 described below) for inputting data from an external source, a memory cell for storing data (for example, memory cell array 300 described below), and a plurality of data write circuits (for example, structural elements corresponding with data write circuits 200–215 described below) for writing the data input from the plurality of data input circuits to the memory cell, wherein data to be stored is input from the external source by selectively using the plurality of data input circuits, and then each bit of the data to be stored is distributed to the plurality of the data write circuits according to a bit configuration of the data, and furthermore of the plurality of data input circuits, data input from a specific data input circuit (for example, components corresponding with data input circuits 100, 104 described below) is distributed to one of the plurality of data write circuits via another data input circuit (for example, components corresponding with data input circuits 115, 111 described below).

According to this construction, data output from a specific data input circuit is input into another data input circuit, and is then distributed to a data write circuit via this other data input circuit. In this manner, by distributing data from a specific data input circuit to another data input circuit, the need to directly distribute the data from the specific data input circuit to the data write circuit which inputs data from the other data input circuit is eliminated. Consequently, the number of data write circuits that make up the output load of the specific data input circuit is lowered, and the output load of this specific data input circuit is reduced. As a result, compatibility with various bit configurations becomes possible without the output load of the specific data input circuit increasing and a delay in the writing of data occurring.

Furthermore, with a semiconductor memory device according to the present invention, a mask control circuit (for example, components corresponding with a mask signal generation circuit 600 described below) for masking writing of data received from the external source by the plurality of data input circuits may be included as an option.

According to this construction, it becomes possible to mask the writing of each bit of data from a plurality of bit configurations, and a variety of data writing configurations can be used.

Moreover, in a semiconductor memory device according to the present invention, the mask control circuit may selectively control the plurality of data write circuits and mask writing of the data based on an externally received predetermined mask signal (for example, signal elements corresponding with mask control signals UDQM, LDQM described below).

According to such a construction, the data input to a plurality of data write circuits from a plurality of data input circuits is selectively written to the memory cell array based on the predetermined mask signal. Consequently, masking the writing of a portion of the bits of the data input from an external source by the plurality of data input circuits becomes possible.

Furthermore, in a semiconductor memory device according to the present invention, a specific address signal (for example, signal elements corresponding with address signals Y9, Y11, Y12 described below) used according to the plurality of types of bit configuration, may influence a signal used to mask writing of the data.

According to such a construction, the data input into the plurality of data write circuits from the plurality of data input circuits is selectively written to the memory cell array based on the specific address signal used according to the plurality of bit configurations. Consequently, it becomes possible to select output data from the data write circuit according to the bit configuration and write the data to the memory cell array without increasing the devices for selecting the output data of the data write circuit. Therefore, even if the variety of bit configurations increases, the circuitry (for example, circuitry for realizing a map incorporated in a memory cell array 300 shown in the appended diagrams of FIG. 1 and FIG. 2) for selecting which data will ultimately be written to the memory cell array need not become more complex.

Furthermore, in a semiconductor memory device according to the present invention, the specific data input circuit may be used for the data of all of the plurality of types of bit configuration.

According to such a construction, the data that is distributed to the highest number of data write circuits is distributed to a plurality of data write circuits via another data input circuit. Consequently, the output load of the specific data input circuit that outputs this data is reduced.

Furthermore, in a semiconductor memory device according to the present invention, another data input circuit may be used for data of all bit configurations from the plurality of types of bit configuration, with an exception of the bit configuration which has the fewest number of bits.

According to such a construction, the data output of a specific data input circuit is distributed to all the data write circuits that are used for data of other bit configurations and data of the bit configuration with the fewest number of bits, via another data input circuit. Consequently, it becomes possible for the data output of a specific data input circuit to be distributed to the data write circuit via a minimum number of other data input circuits.

Furthermore, in a semiconductor memory device according to the present invention, the specific data input circuit may be used for data of all of the plurality of types of bit configuration, and another data input circuit may be used for data of all bit configurations from the plurality of types of bit configuration, with an exception of the bit configuration which has the fewest number of bits.

According to such a construction, the data that is distributed to the most data write circuits is distributed to a plurality of data write circuits via another data input circuit. Consequently, the load placed on the specific data input circuit that outputs this data is reduced. Furthermore, the data output of a specific data input circuit is distributed to all the data write circuits that are used for data of other bit configurations and data of the bit configuration with the fewest number of bits, via another data input circuit. Consequently, it becomes possible for the data output of a specific data input circuit to be distributed to the data write circuit via the minimum number of other data input circuits.

Furthermore, in a semiconductor memory device according to the present invention, another data input circuits may be equipped with; an input buffer section (for example, components corresponding with an input buffer section 115A described below) for inputting data from the external source, a selection section (for example, components corresponding with selection section 115B described below) for selecting data input from either one of the input buffer section and the specific data input circuit, and a driver section (for example, components corresponding with a driver section 115C described below) for outputting data selected by the selection section to one of the plurality of data write circuits.

According to such a construction, data from an external source is received by the input buffer section in another data input circuit. Here, data input by the specific data input circuit, after being selected by the selection section, is output to the data write circuit via the driver section. Consequently, it becomes possible for data output from a specific data input circuit to be distributed to one of a plurality of data write circuits via another data input circuit.

Furthermore, in a semiconductor memory device according to the present invention, the selection section may be constructed so that, during a manufacturing process of a semiconductor memory device, an input section of the driver section may be electrically connected with an output section of either one of the input buffer section and the specific data input circuit.

According to such a construction, semiconductor memory devices compatible with each variety of bit configuration can be differentiated in the manufacturing process. Consequently, the bit configuration of the data to be stored is fixed at the time of manufacture, and the user who will use this semiconductor memory device does not need to set the state of the circuitry in accordance with the bit configuration of the data to be stored.

DETAILED DESCRIPTION OF THE PREFERRED EMBODIMENTS

As follows, semiconductor memory devices according to a preferred embodiment of the present invention will be described with reference to the drawings.

Embodiment 1

Figure 1:
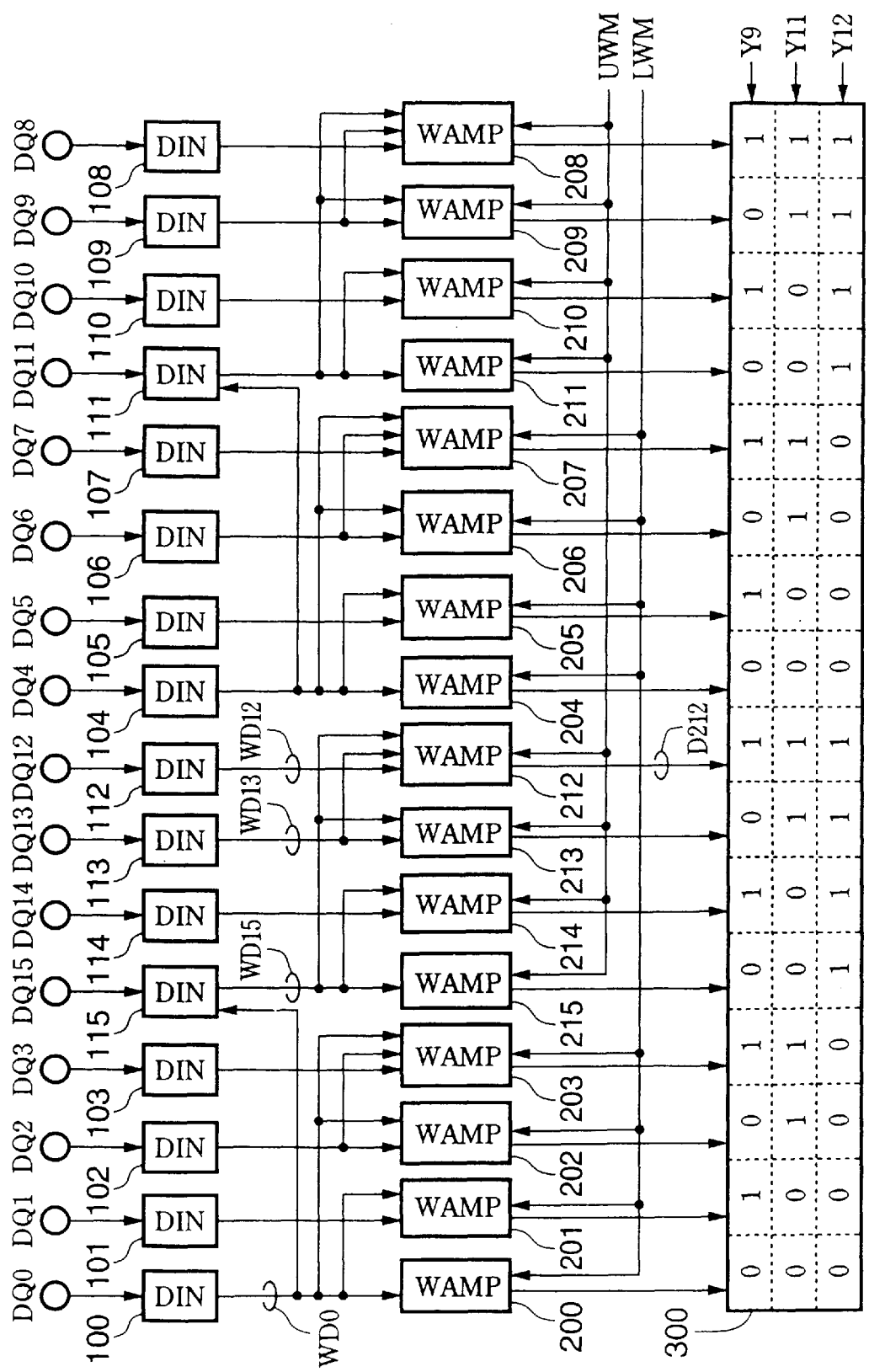
FIG. 1 is a block diagram showing a sample construction of a write system of a semiconductor memory device according to an embodiment of the present invention.

FIG. 1 shows a sample construction of a data write system of a semiconductor memory device according to an embodiment 1 of the invention. The semiconductor memory device is compatible with data of four types of bit configuration, ×16 bit configuration, ×8 bit configuration, ×4 bit configuration and ×2 bit configuration. The data write system comprises a plurality of data input circuits 100–115 (DIN in the figure) for inputting 16 bit data DQ0–DQ15 from an external source, and a plurality of data write circuits 200–215 (WAMP in the figure) for writing the data input by these data input circuits to memory cells in a memory cell array 300.

Here, of the data input circuits 100–115, data input by a specific data input circuit 100 is distributed to the data write circuits 212–215 via another data input circuit 115, and data input by a specific data input circuit 104 is distributed to the data write circuits 208–211 via another data input circuit 111. The data input circuits 100–115 are used selectively for inputting data to be stored from an external source, and are constructed so that each bit of the data is distributed to the data write circuits 200–215 according to the bit configuration of the data to be stored.

As follows is a more detailed description of the construction.

The data output WD0 of the data input circuit 100 is distributed to four data write circuits 200–203 and the data input circuit 115. The data output of the data input circuit 101 is distributed only to the data write circuit 201, the data output of the data input circuit 102 is distributed to two data write circuits 202 and 203, and the data output of the data input circuit 103 is distributed only to the data write circuit 203. Furthermore, the data output WD15 of the data input circuit 115 is distributed to four data write circuits 212–215, the data output of the data input circuit 114 is distributed only to the data write circuit 214, the data output of the data input circuit 113 is distributed to two data write circuits 212 and 213, and the data output of the data input circuit 112 is distributed only to the data write circuit 212.

In a similar manner, the data output of the data input circuit 104 is distributed to four data write circuits 204–207 and the data input circuit 111. The data output of the data input circuit 105 is distributed only to the data write circuit 205, the data output of the data input circuit 106 is distributed to two data write circuits 206 and 207, and the data output of the data input circuit 107 is distributed only to the data write circuit 207. Furthermore, the data output of the data input circuit 111 is distributed to four data write circuits 208–211, the data output of the data input circuit 110 is distributed only to the data write circuit 210, the data output of the data input circuit 109 is distributed to two data write circuits 208 and 209, and the data output of the data input circuit 108 is distributed only to the data write circuit 208.

In the present embodiment, the specific data input circuits 100 and 104 are used for data of all of a plurality of bit configurations, and other data input circuits 111 and 115 are used for the data of all bit configurations excluding that bit configuration which has the fewest number of bits.

Furthermore, the present embodiment is constructed so that a mask signal generation circuit 600 (see FIG. 6), described below, can be included as an option. This mask signal generation circuit 600 masks the writing of either a portion of, or all of the bits of data DQ0–DQ15, input from an external source by the data input circuits 100–115, while controlling the writing of the data to the memory cell array. Specifically, of the data write circuits 200–215 and of the 16 bit data DQ0–DQ15, a mask signal LWM for masking the writing of the lower 8 bits is input into the data write circuits 200–207 from the mask signal generation circuit 600 (described below), and a mask signal UWM for masking the writing of the upper 8 bits is input into the data write circuits 208–215 by the same mask signal generation circuit 600.

Figure 2:
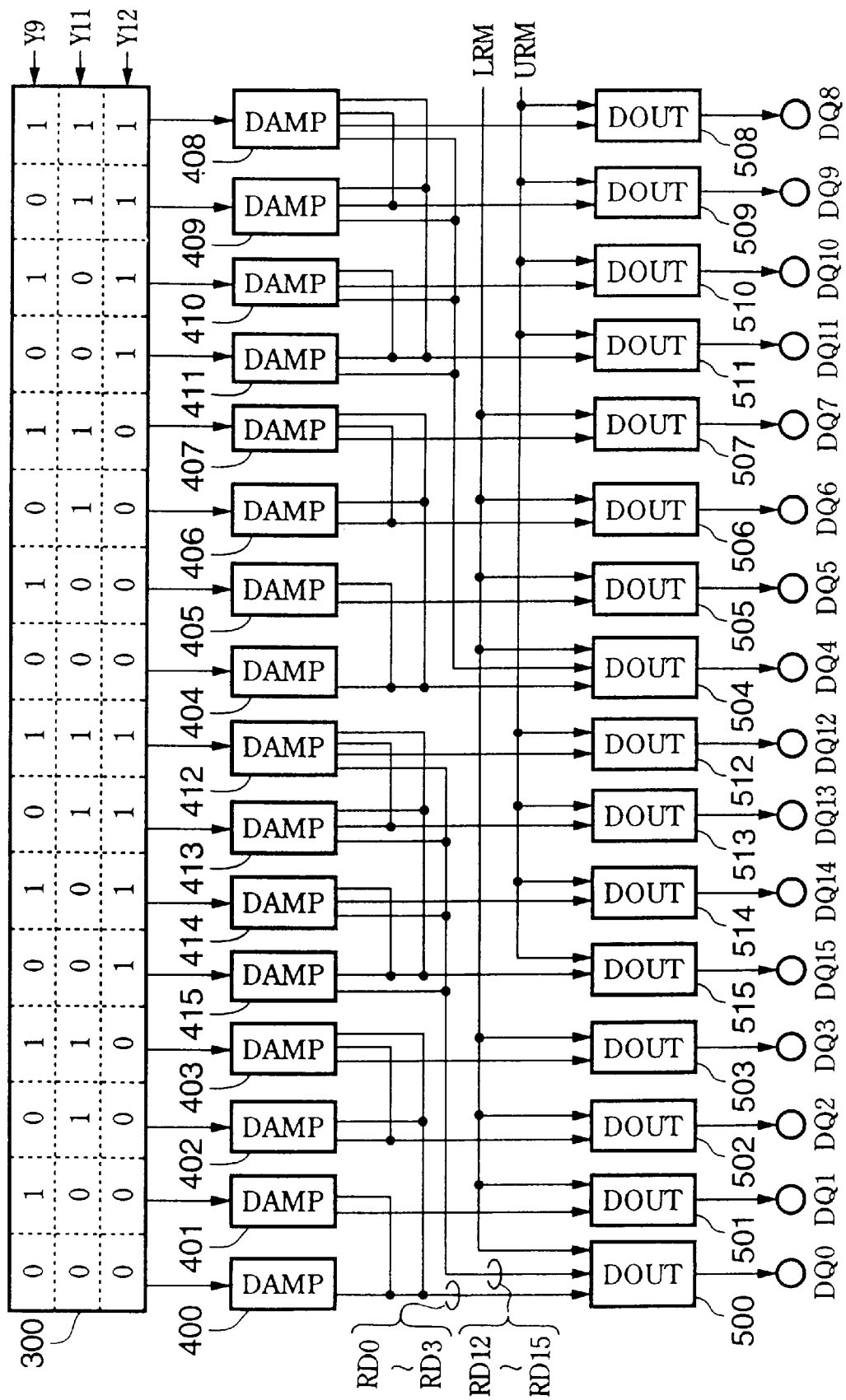
FIG. 2 is a block diagram showing a sample construction of a read system of a semiconductor memory device according to an embodiment of the present invention.

FIG. 2 shows a sample construction of a data read system of a semiconductor memory device according to the present embodiment. This data read system comprises data amplifiers 400–415 for inputting and amplifying the 16 bit data from memory cell array 300, and data output circuits 500–515 for outputting externally data amplified by these data amplifiers.

Here, data amplified by the data amplifiers 400–415 is output externally via one of the data output circuits 500–515. The relationship of the data output circuits 500–515 to the data amplifiers 400–415 coincides with the relationship of the data input circuits 100–115 to the data write circuits 200–215 in the aforementioned data write system.

As follows is a more detailed description of the read system.

Data (one of RD0–RD3) amplified by one of the data amplifiers 400–403 and data (one of RD12–RD15) amplified by one of the data amplifiers 412–415 is provided to the data output circuit 500, whereas only data amplified by the data amplifier 401 is provided to the data output circuit 501. Data amplified by one of either of the data amplifiers 402 or 403 is provided to the data output circuit 502, whereas only data amplified by the data amplifier 403 is provided to the data output circuit 503.

Furthermore, data amplified by one of the data amplifiers 412–415 is provided to the data output circuit 515, and only data amplified by the data amplifier 414 is provided to the data output circuit 514. Data amplified by one of either of the data amplifiers 412 or 413 is provided to the data output circuit 513, and only data amplified by the data amplifier 412 is provided to the data output circuit 512.

In a similar manner, data amplified by one of the data amplifiers 404–407 and data amplified by one of the data amplifiers 408–411 is provided to the data output circuit 504, and only data amplified by the data amplifier 405 is provided to the data output circuit 505. Data amplified by one of either of the data amplifiers 406 or 407 is provided to the data output circuit 506, and only data amplified by the data amplifier 407 is provided to the data output circuit 507.

Furthermore, data amplified by one of the data amplifiers 408–411 is provided to the data output circuit 511, and only data amplified by the data amplifier 410 is provided to the data output circuit 510. Data amplified by one of either of the data amplifiers 408 or 409 is provided to the data output circuit 509, and only data amplified by the data amplifier 408 is provided to the data output circuit 508.

Here, the decision as to which amplifier of the data amplifiers 400–415 will amplify and output data is determined based on the aforementioned address signals Y9, Y11, and Y12. For example, data amplified by one of the data amplifiers 400–403 is input into the data output circuit 500, but which data will be input is determined by the address signal Y9 and the address signal Y11. Furthermore, data amplified by one of the data amplifiers 412–415 is input into this same data output circuit 500, but which data is input is determined by the address signal Y9 and the address signal Y11 in the same manner. Moreover, of the data from the data amplifiers 400–403 and the data from the data amplifiers 412–415, the decision as to which data will be output is determined in the data output circuit 500 based on the address signal Y12.

In other words, the output data of only one of the data amplifiers from the data amplifiers 400–403 and 412–415 is output as the data DQ0, in accordance with the address signals Y9, Y11, and Y12.

Figure 3:
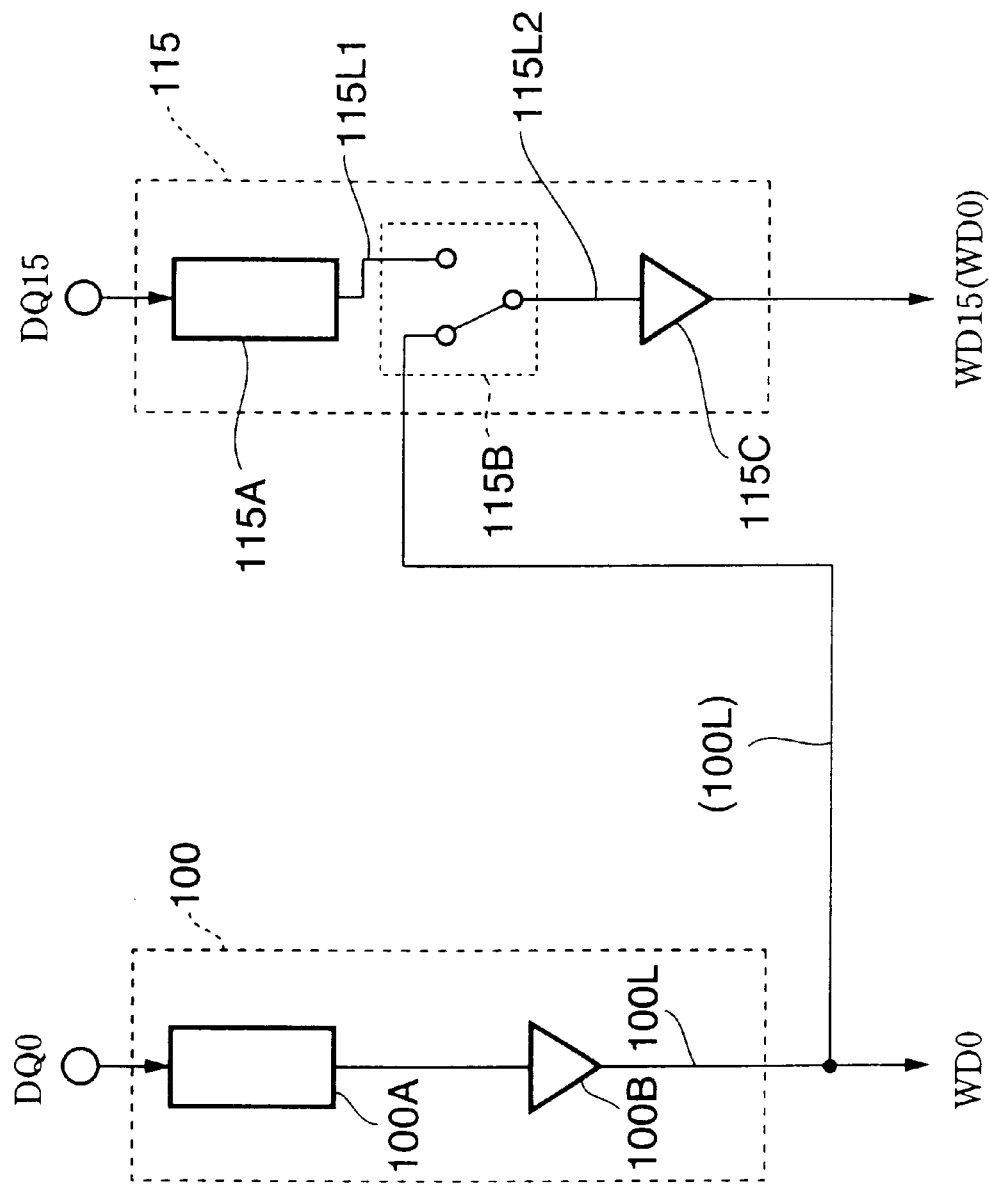
FIG. 3 is a circuit diagram showing a detailed sample construction of a data input circuit according to an embodiment of the present invention.

FIG. 3 shows a detailed construction of a specific data input circuit 100 and another data input circuit 115.

As shown in this diagram, the data input circuit 100 comprises an input buffer 100A for inputting data DQ0 received from an external source, and a driver section 100B for outputting this data input by the input buffer 100A. The remaining data input circuits, excluding the data input circuits 115 and 111 are constructed in the same manner as the data input circuit 100.

Data input circuit 115, to which the data output of the aforementioned data input circuit 100 is distributed, comprises an input buffer 115A for inputting data DQ15 from an external source, a selection section 115B for selecting data input from either the input buffer 115A or the aforementioned data input circuit 100, and a driver section 115C for outputting the data selected by the selection section 115B to the data write circuits 212–215.

Here, the selection section 115B, in the manufacturing process of this semiconductor memory device, is designed so that the output section of either the input buffer 115A of the data input circuit 115 or the aforementioned data input circuit 100, and the input section of the driver section 115C of this data input circuit 115 are electrically connected. Specifically, the selection section 115B is formed in the metal wiring process, and electrically connects, for example, one of either wiring 100L which is connected to the output section of the data input circuit 100, or wiring 115L1 which is connected to the output section of the input buffer 115A of the data input circuit 115, and wiring 115L2 which is connected to the input section of the driver section 115C of the data input circuit 115.

The decision as to which of the wiring 100L of the data input circuit 100 and the wiring 115L1 of the data input circuit 15 will be connected to the wiring 115L2 of the driver section 115C is determined according to the bit configuration of the data to be stored. In the present embodiment, when the object is to be compatible with 2 bit data, the wiring 100L and the wiring 115L2 are electrically connected. When the object is to be compatible with other bit configurations, the wiring 115L1 and the wiring 115L2 are connected.

Moreover, the present invention is not restricted to this example, and a selection section 115B may also be constructed from a switching circuit with a transfer gate. Specifically, the selection section may be designed so that a transfer gate is provided between the wiring 100L and the wiring 115L2 and between wiring 115L1 and wiring 115L2, and when an ×2 bit configuration is taken, the transfer gate provided between the wiring 100L and the wiring 115L2 is made to conduct, and for other configurations, the transfer gate provided between the wiring 115L1 and the wiring 115L2 is made to conduct.

Figure 4:
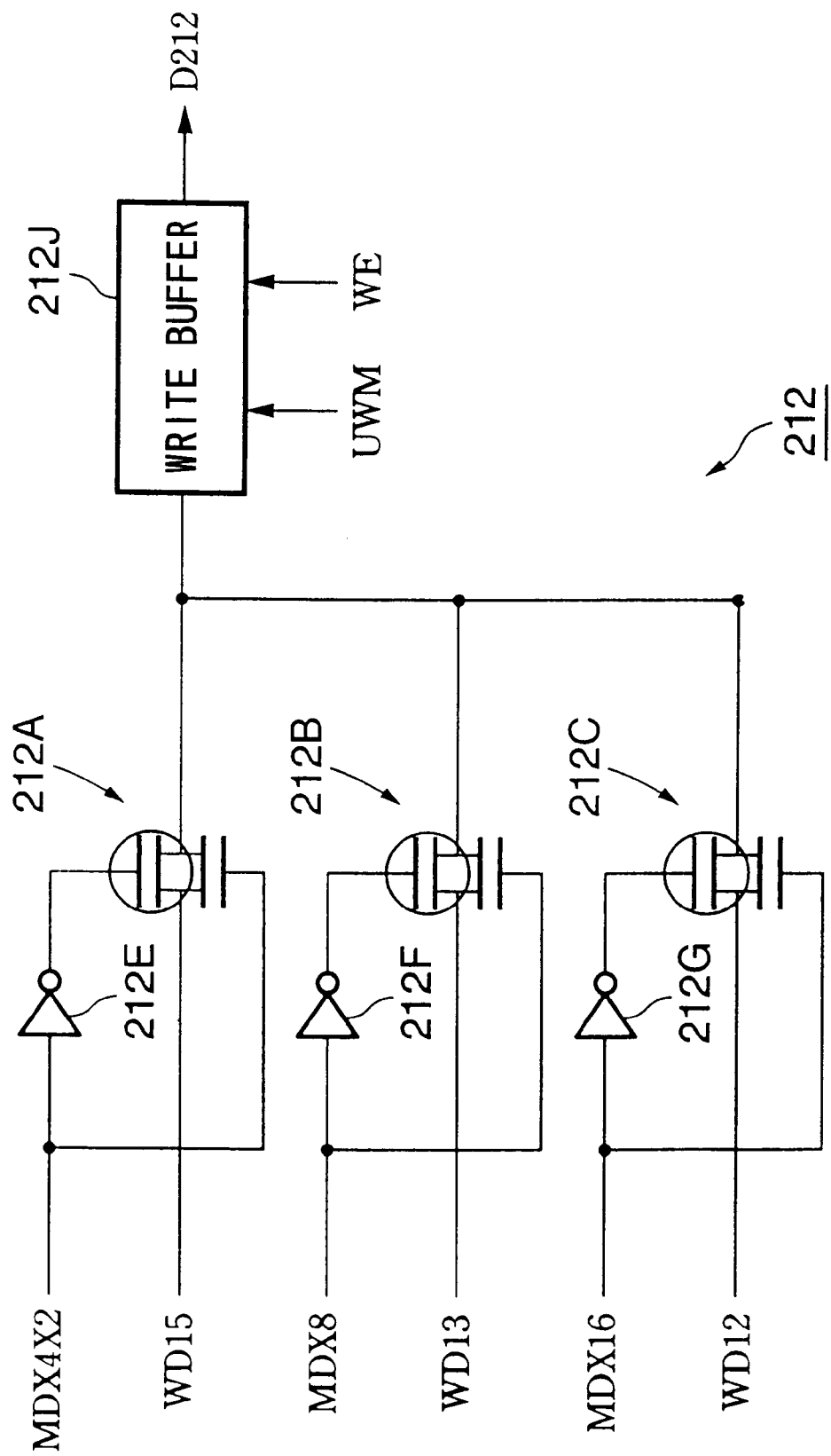
FIG. 4 is a circuit diagram showing a sample construction of a data write circuit according to an embodiment of the present invention.

FIG. 4 shows a detailed construction of the data write circuit 212 (see FIG. 1).

As shown in the figure, the data write circuit 212 comprises transfer gates 212A–212C and inverters 212E–212G for selecting data from one of either the data WD15 from the data input circuit 115, the data WD13 from the data input circuit 113 or the data WD12 from the data input circuit 112, and a write buffer 212J for writing the data selected to the memory cell array 300.

Here, the conduction of the transfer gate 212A is controlled by a mode signal MDX4X2 which is activated in the case of ×2 bit configurations and ×4 bit configurations, and the data output WD15 of the data input circuit 115 is provided to the write buffer 212J. Furthermore, the conduction of the transfer gate 212B is controlled by a mode signal MDX8 which is activated in the case of ×8 bit configurations, and the data output WD13 of the data input circuit 113 is provided to the write buffer 212J. Furthermore, the conduction of the transfer gate 212C is controlled by a mode signal MDX16 which is activated in the case of ×16 bit configurations, and the data output WD12 of the data input circuit 112 is provided to the write buffer 212J. The write buffer 212J writes one of the data WD15, WD13 or WD12, selectively provided from each transfer gate, to the memory cell array 300 as the data D212.

In the same manner, the other data write circuits are constructed so as to select data that is output from each data input circuit in accordance with the data bit configuration, and write this data to the memory cell array 300.

Figure 5:
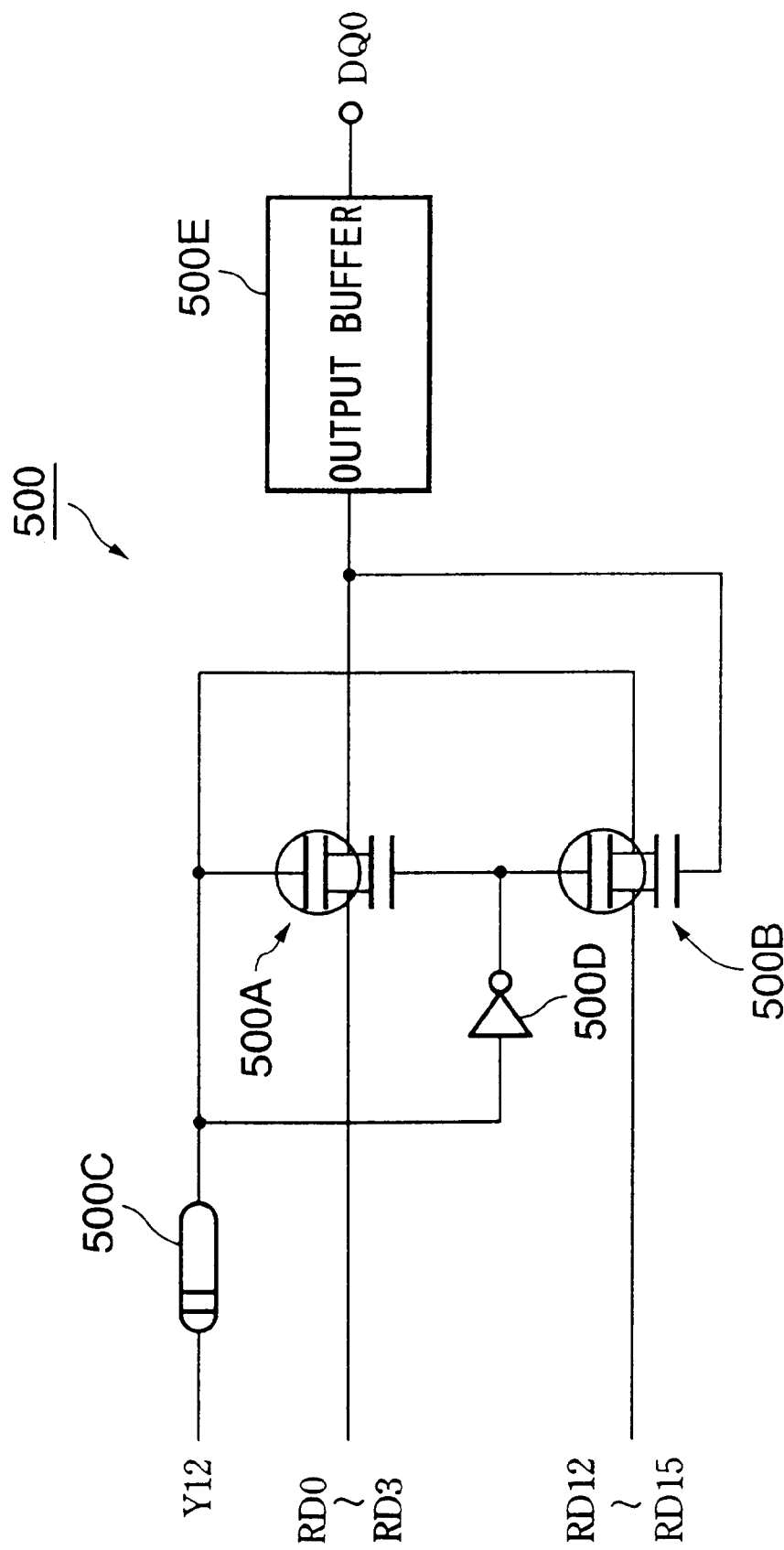
FIG. 5 is a circuit diagram showing a sample construction of a data output circuit according to an embodiment of the present invention.

FIG. 5 shows a detailed construction of the data output circuit 500 (see FIG. 2)

As shown in the figure, the data output circuit 500 comprises; transfer gates 500A and 500B, a delay circuit 500C and an inverter 500D, for selecting data from either one of the aforementioned data amplifiers 400–403 (one of the data RD0–RD3) or data from one of the data amplifiers 412–415 (one of data RD12–RD15), and an output buffer 500E for outputting this selected data as the data DQ0. Moreover, the purpose of the delay circuit 500C is to adjust the timing when data is output externally. In the same manner, the other data output circuits are constructed so as to select data that is output from each data amplifier in accordance with the data bit configuration, and output this data externally.

Figure 6:
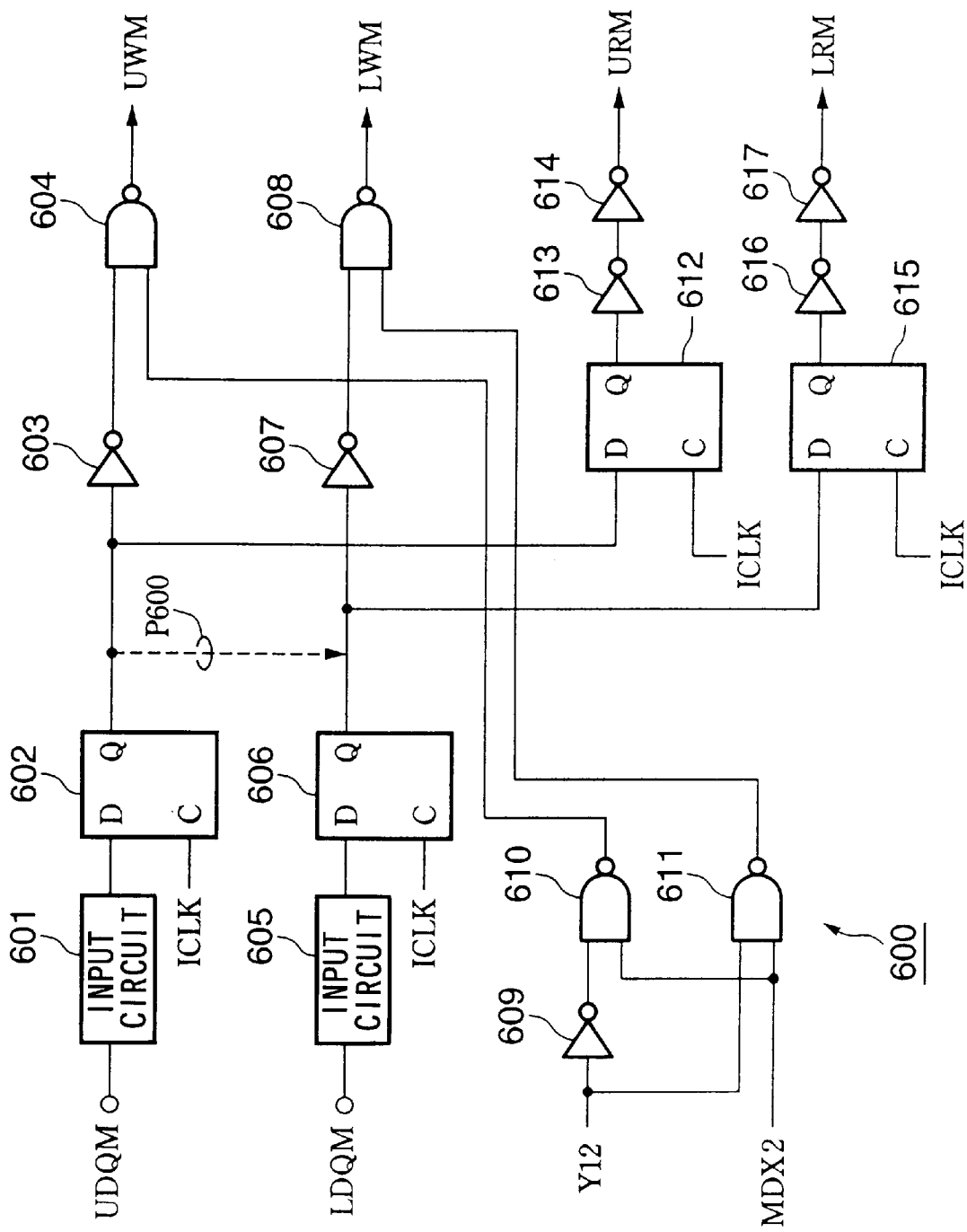
FIG. 6 is a circuit diagram showing a sample construction of a mask signal generation circuit according to an embodiment of the present invention.

FIG. 6 shows a sample construction of a mask signal generation circuit 600 for generating mask signals UWM and LWM which are provided to the aforementioned data write circuits 200–215.

This mask signal generation circuit 600 selectively controls a plurality of data write circuits 200–215 based on the externally applied predetermined mask control signals UDQM and LDQM, and masks the writing of the data DQ0–DQ15. The mask signal generation circuit 600 comprises input circuits 601 and 605, flip-flops 602, 606, 612 and 615, inverters 603, 607, 609, 613, 614, 616 and 617, and NAND circuits 604, 608, 610 and 611.

Here, the purpose of the input circuit 601 is to receive the mask control signal UDQM from an external source, and the received mask control signal UDQM is provided to the flip-flop 602. The flip-flop 602 synchronizes the signal (UDQM) taken into the input circuit 601 with an internal clock ICLK, and then retains the signal. The signal (UDQM) retained in the flip-flop 602 is output to the aforementioned data write circuits 208–215 as the mask signal UWM via the inverter 603 and the NAND 604. In a similar manner, the purpose of the input circuit 605 is to receive the mask control signal LDQM received from an external source. The mask control signal LDQM received by the data input circuit 605 is retained in the flip-flop 606, and output to the aforementioned data write circuits 200–207 as the mask signal LWM via the inverter 607 and the NAND 608.

The flip-flop 612 delays the signal (UDQM) retained in the aforementioned flip-flop 602 by a predetermined amount of time, and the signal (UDQM) retained in this flip-flop 612 is output to the aforementioned data output circuits 508–515 via the inverters 613 and 614 as a mask signal URM. In a similar manner, the flip-flop 615 delays the signal (LDQM) retained in the aforementioned flip-flop 606, by a predetermined amount of time, and the signal (LDQM) retained in the flip-flop 606, after being delayed for a predetermined amount of time by the flip-flop 615, is output to the aforementioned data output circuits 500–507 via the inverters 616, 617 as a mask signal LRM.

In this example, when 16 bit data is to be written, the data write circuits 200–207 are controlled by the mask signal LWM, and the data write circuits 208–215 are controlled by the mask signal UWM. Consequently, of the 16 bit data DQ0–DQ15, the writing of data of the lower 8 bits DQ0–DQ7 and the writing of the data of the upper 8 bits DQ8–DQ15 can each be masked. Furthermore, when handling data of an ×2 bit configuration, an ×4 bit configuration or an ×8 bit configuration, a signal path P600 is formed from the output section of the flip-flop 602 to the output section of the flip-flop 606, as in FIG. 6. Consequently, the logical value of the mask signal UWM and the logical value of the mask signal LWM become equivalent, and only the mask control signal UDQM received from an external source is effective. In this case, for the data of ×2 bit configuration, ×4 bit configuration and ×8 bit configuration, the decision as to whether the writing of all bits will be masked or not is controlled by the mask control signal UDQM.

Figure 7:
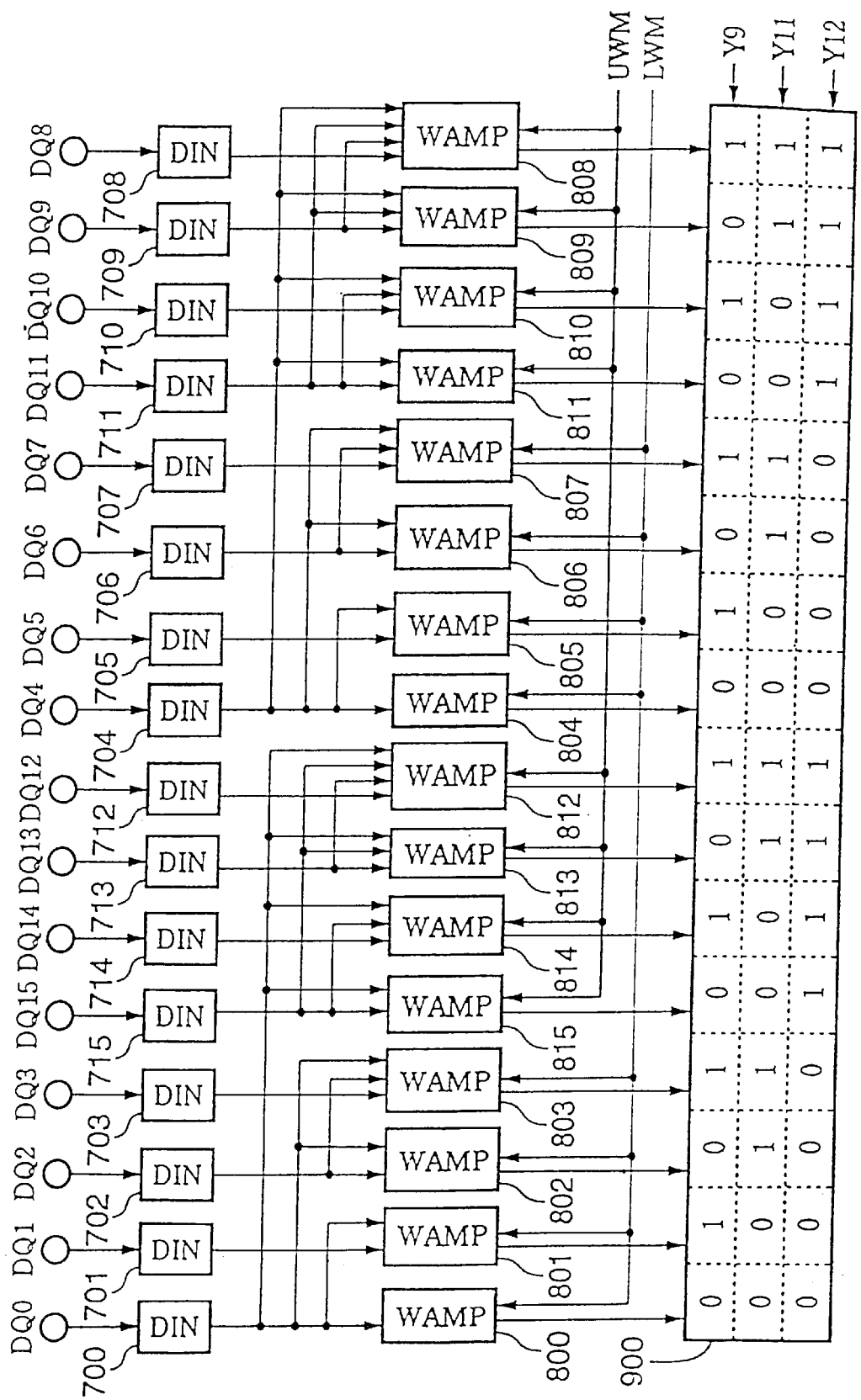
FIG. 7 is a block diagram showing a sample construction of a write system of a semiconductor memory device according to conventional technology.
Figure 8:
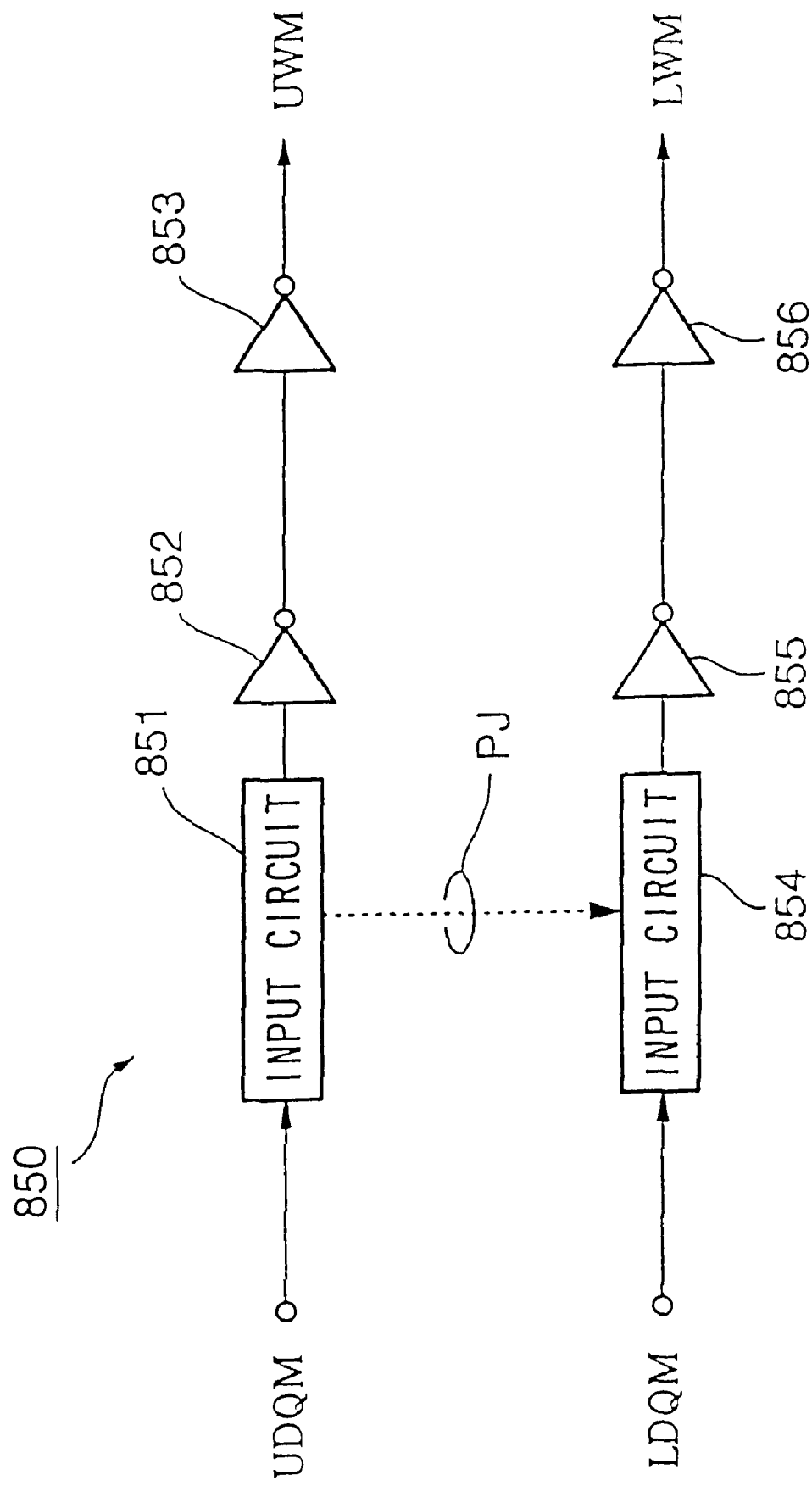
FIG. 8 is a circuit diagram showing a sample construction of a mask signal generation circuit according to conventional technology.

The memory cell array 300, as seen in FIG. 1 and FIG. 2, is similar to the aforementioned memory cell array 900 according to conventional technology (see FIG. 7), and incorporates a map of the address signals Y9, Y11 and Y12, used according to the bit configuration of the data to be stored. According to this map, when 16 bit data is to be stored none of address signals Y9, Y11, Y12 are used, and the 16 bit data output by the data write circuits 200–215 is written directly to the memory cell array 300. Furthermore, when 8 bit data is to be stored, one of the data write circuits 201, 203, 205, 207, 208, 210, 212, 214 or one of the data write circuits 200, 202, 204, 206, 209, 211, 213, 215 is selected by the address signal Y9. In this case, the address signals Y11 and Y12 are not used.

Furthermore, when 4 bit data is to be stored, one of the data write circuits 202, 203, 206, 207, 208, 209, 212, 213 or one of the data write circuits 200, 201, 204, 205, 210, 211, 214, 215 is selected by the address signal Y11, and one quarter of the total data write circuits are selected by the address signals Y9 and Y11. In this case, the address signal Y12 is not used. Moreover, when 2 bit data is to be stored, one of either the data write circuits 200–207 or the data write circuits 208–215 is selected by the address signal Y12, and one eighth of the total data write circuits are selected by the address signals Y9, Y11 and Y12.

Although not shown in the figures, the data which is output by the data write circuits selected by address signals Y9, Y11 and Y12 is written to memory cells in the memory cell array 300 based on other address signals.

As follows is a description of the operation of the semiconductor memory device according to the present embodiment.

Firstly, when data of ×4 bit, ×8 bit or ×16 bit configurations is to be stored, the wiring 115L1 and the wiring 115L2 in FIG. 3 are connected.

When, for example, 16 bit data is to be stored, then during the manufacturing process the circuitry is made so that the data write circuit 200 receives the data output of the data input circuit 100, and the data write circuit 201 receives the data output of the data input circuit 101, so that in this manner, the data write circuits 200–215 each receive the data output from a single corresponding data input circuit.

Furthermore, when for example, 8 bit data is to be stored, then during the manufacturing process the circuitry is made so that the data write circuits 200 and 201 receive the data output of the data input circuit 100, and the data write circuits 202 and 203 receive the data output of the data input circuit 102, so that in this manner, the data output of one data input circuit is received by two data write circuits.

Furthermore, when 4 bit data is to be stored, then during the manufacturing process the circuitry is made so that the data write circuits 200–203 receive the data output of the data input circuit 100, and the data write circuits 212–215 receive the data output of the data input circuit 115, so that in this manner the data output of each data input circuit is received by four data write circuits.

Moreover, in the above example, when 8 bit data is to be stored, a decision as to which data from which of the data write circuits 200 or 201, which receive the data output of the data input circuit 100 in common, will be written to the memory cell array 300 is determined based on an externally received column address signal.

Next, is a description of the operation of this embodiment when 2 bit data is to be stored.

Firstly, when 2 bit data is to be stored, then in the manufacturing process (such as a wafer process or an assembly process), the wiring 100L of the data input circuit 100 shown in FIG. 3 is electrically connected with the wiring 115L2 of the data input circuit 115. However, the wiring 115L1 of the data input circuit 115 is not connected with the wiring 115L2. Consequently, the output section of the data input circuit 100 is connected to the input section of the driver section 115C of the data input circuit 115, and this data input circuit 115 outputs the data DQ0 input to the data input circuit 100 as the data WD15 in place of the original data DQ15. The selection state of the selection section of the data input circuit 111 is set in the same manner, and the output section of the data input circuit 104 is connected with the input section of the driver section of the data input circuit 111.

Next, only the mode signal MDX4X2 which is input into the data write circuit 212 shown in FIG. 4 is activated, and the others, namely the mode signal MDX8 and the mode signal MDX16, are fixed in an inactive state. The setting of the active state of these mode signals is, in the same manner as the aforementioned data input circuit, performed during the manufacturing process of the circuits for generating these mode signals. In a similar manner, for other data write circuits, the active state of the mode signals is set, and the necessary data is received into each of the data write circuits.

The Write Operation

With each mode signal set in the manner described above, a write operation is then performed in the manner described below.

In FIG. 1, the data WD0 output by the data input circuit 100, as well as being distributed to, and received by, the data write circuits 200–203, is also distributed to the data input circuit 115. Then, the data DQ0 distributed from the data input circuit 100 is provided to the data write circuits 212–215 from the data input circuit 115 as the data WD15. In a similar manner, the data output from the data input circuit 104 is distributed to the data write circuits 204–207 and the data input circuit 111. Then, the data DQ4 output from the data input circuit 104 is provided to the data write circuits 208–211 as data output from the data input circuit 111.

In other words, in this case, the data DQ0 input by the data input circuit 100 from an external source is distributed in common to the data write circuits 200–203, 212–215. Furthermore, the data DQ4 input by the data input circuit 104 is distributed in common to the data write circuits 204–207, 208–211. As a result, the 2 bit data comprising the data DQ0 and the data DQ4 is provided to the data write circuits 200–215.

Next, the data output from each of the data write circuits 200–215 is selected based on the address signals Y9, Y11 and Y12, and the data is written to the memory cell array 300. Specifically, of the 8 bits output by the data write circuits 200–203 and 212–215, 1 bit of data is selected based on the address signals Y9, Y11 and Y12 and written to the memory cell array 300. In a similar manner, of the 8 bits output by the data write circuits 204–207 and 208–211, 1 bit of data is selected based on the address signals Y9, Y11 and Y12 and written to the memory cell array 300.

Here, the address signal Y12, in the mask signal generation circuit 600 shown in FIG. 6, influences the mask signals UWM and LWM used for masking the writing of data, and these mask signals UWM and LWM behave much like a complementary signal for the address signal Y12. For example, when the address signal Y12 is high level, the mask signal UWM becomes low level and the mask signal LWM becomes high level, and only the data write circuits 200–207 are activated.

Consequently, in this case, of the data write circuits 200–203 and 212–215 which receive the data WD0 (DQ0) in common from the data input circuit 100, the data write circuits 200–203 are selected by the address signal Y12 (mask signal LWM). In addition, one of these data write circuits 200–203 is selected by the address signals Y11 and Y12. As a result, of the data write circuits 200–203 and 212–215, which receive the data DQ0 in common, only one data write circuit is selected, and the data output from this data write circuit is ultimately written to the memory cell array 300.

In a similar manner, one of the data write circuits from 204–207 or 208–211, which in common receive data DQ4, is selected by address signals Y9, Y11 and Y12. Then, the data output from this selected data write circuit is ultimately written to the memory cell array 300.

The Read Operation

Next is a description of the read operation.

The data written to the memory cell array 300 is amplified by the data amplifier (see FIG. 2) selected by the address signals Y9 and Y11, and read from the memory cell array 300, and two pieces of data are output to each of the data output circuits 500 and 504 respectively. Then, in each data output circuit, the data is ultimately selected based on the address signal Y12 and output externally.

Specifically, one of the data RD0–RD3 which is output from the data amplifiers 400–403 is selected based on the address signals Y9 and Y11, and is provided to the data output circuit 500. In a similar manner, one of the data RD12–RD15 which is output from the data amplifiers 412–415 is selected based on the address signals Y9 and Y11, and is provided to the data output circuit 500. In other words, two pieces of data, namely the data from the data amplifiers 400–403 (one of RD0–RD3) and the data from the data amplifiers 412–415 (one of RD12–RD15), are input into the data output circuit 500. In a similar manner, two pieces of data, namely the data from the data amplifiers 404–407 (one of RD4–RD7) and the data from the data amplifiers 408–411 (one of RD8–RD11), are input into the data output circuit 504.

Subsequently, in the data output circuit 500 shown in FIG. 5, and based on the address signal Y12, one of either the transfer gate 500A or the transfer gate 500B conducts, and one of either the data from the data amplifiers 400–403 (one of RD0–RD3) or the data from the data amplifiers 412–415 (one of RD12–RD15) is output externally via the output buffer 500E as the data DQ0. In a similar manner, in the data output circuit 504, and based on the address signal Y12, one of either the data from the data amplifiers 404–407 (one of RD4–RD7) or the data from the data amplifiers 408–411 (one of RD8–RD11) is output externally as the data DQ4.

As a result of the above operations, 2 bit data comprising the data DQ0 and the data DQ4 is written to, or read from, the memory cell array 300.

According to the present embodiment, when the data input circuit 100, which inputs one of the bits of the data, distributes the data WD0 (DQ0) to the data write circuits 200–203 and 212–215, the data WD0 is distributed to the data write circuits 212–215 via the data input circuit 115. As a result, the data input circuit 100 can distribute the data WD0 to the data input circuit 115 instead of to the plurality of data write circuits 212–215, and the load from the wiring for distributing data to the plurality of data write circuits 212–215 will not contribute in terms of the output load of the data input circuit 100. Consequently, the output load of the data input circuit 100 is reduced, and the delay in the data to be written can be suppressed to a minimum. The same can also be said for the data input circuit 104 which inputs the other bit of the data.

Although the invention has been described herein with reference to a preferred embodiment, the present invention is not limited to the embodiments described herein, and changes in form and details may be made therein without departing from the spirit and scope of the present invention. For example, in the embodiment described above a function for masking the writing of data (mask function) was provided, but this is not to be construed in a limiting sense, and the present invention may also be applied to a semiconductor memory device which has no such mask function.

Furthermore, the above embodiment was described using an example where 2 bit data was to be stored, but this is not to be construed in a limiting sense, and the present invention may be applied to any bit configuration.

Moreover, in the above embodiment, the data output from the data input circuit 100 was output to the data write circuits 212–215 via the data input circuit 115, but this is not to be construed in a limiting sense, and the data may also be distributed via two or more other data input circuits.

What is claimed is:

1. A semiconductor memory device which is compatible with data of a plurality of types of bit configuration, comprising:

a plurality of data input circuits for inputting data from an external source, a memory cell for storing data, and a plurality of data write circuits for writing said data input from said plurality of data input circuits to said memory cell, wherein data to be stored is input from said external source by selectively using said plurality of data input circuits, and then each bit of said data to be stored is distributed to said plurality of data write circuits according to a bit configuration of said data from a first data input circuit to a second data input circuit, different from said first data input circuit, said second data input circuit receiving said data from said first data input circuit and propagating said data to at least one of said plurality of data write circuits that do not receive said data from said first data input circuit.

2. A semiconductor memory device according to claim 1, wherein a mask control circuit for masking writing of data received from said external source by said plurality of data input circuits is included as an option.

3. A semiconductor memory device according to claim 2, wherein said mask control circuit selectively controls said plurality of data write circuits and masks writing of said data based on an externally received predetermined mask signal.

4. A semiconductor memory device according to claim 2, wherein a specific address signal used according to said plurality of types of bit configuration influences a signal used to mask writing of said data.

5. A semiconductor memory device according to claim 1, wherein said first data input circuit is used for data of all of said plurality of types of bit configuration.

6. A semiconductor memory device according to claim 1, wherein said second data input circuit is used for data of all of said plurality of types of bit configuration, with an exception of the bit configuration which has the fewest number of bits.

7. A semiconductor memory device according to claim 1, wherein said first data input circuit is used for data of all of said plurality of types of bit configuration, and said second data input circuit is used for data of all bit configurations from said plurality of types of bit configuration, with an exception of the bit configuration which has the fewest number of bits.

8. A semiconductor memory device according to claim 1, wherein said second data input circuit is equipped with:

an input buffer section for inputting data from said external source, a selection section for selecting data input from either one of said input buffer section and said specific data input circuit, and a driver section for outputting data selected by said selection section to one of said plurality of data write circuits.

9. A semiconductor memory device according to claim 8, wherein said selection section is constructed so that, during a manufacturing process of a semiconductor memory device, an input section of said driver section is electrically connected with an output section of either one of said input buffer section and said first data input circuit.

* * * * *